United States Patent
Chen et al.

(10) Patent No.: US 7,957,436 B2
(45) Date of Patent: Jun. 7, 2011

(54) LASER FOR PROVIDING PULSED LIGHT AND REFLECTOMETRIC APPARATUS INCORPORATING SUCH A LASER

(75) Inventors: Hongxin Chen, Quebec (CA); Gregory Walter Schinn, Quebec (CA)

(73) Assignee: EXFO Inc., Quebec (CA)

( * ) Notice: Subject to any disclaimer, the term of this patent is extended or adjusted under 35 U.S.C. 154(b) by 137 days.

(21) Appl. No.: 12/373,986

(22) PCT Filed: Jul. 18, 2007

(86) PCT No.: PCT/CA2007/001260
§ 371 (c)(1),
(2), (4) Date: Jan. 15, 2009

(87) PCT Pub. No.: WO2008/009110
PCT Pub. Date: Jan. 24, 2008

(65) Prior Publication Data
US 2009/0310627 A1    Dec. 17, 2009

Related U.S. Application Data

(60) Provisional application No. 60/831,448, filed on Jul. 18, 2006.

(51) Int. Cl.
*H01S 3/10* (2006.01)
(52) U.S. Cl. .................. 372/25; 372/94; 372/6
(58) Field of Classification Search .......... 372/6, 25, 372/94
See application file for complete search history.

(56) References Cited

U.S. PATENT DOCUMENTS

| 5,179,420 | A  |   | 1/1993 | So et al. |
|-----------|----|---|--------|-----------|
| 5,331,403 | A  | * | 7/1994 | Rosker et al. .............. 356/459 |
| 6,546,037 | B2 | * | 4/2003 | Stamm et al. .............. 372/57 |
| 6,792,215 | B1 | * | 9/2004 | Kobayashi et al. ........ 398/161 |
| 7,016,023 | B2 |   | 3/2006 | Peerlings |

FOREIGN PATENT DOCUMENTS
WO    WO2007056051    4/2007

OTHER PUBLICATIONS
Adachi, et al "Analysis and Design of Q-Switched Erbium-Doped Fiber Lasers and Their Application to ODTR" IEEE Journal of Lightwave Technology, vol. 20, No. 8 pp. 1506-1511, Aug. 2002.

(Continued)

*Primary Examiner* — Tod T Van Roy
(74) *Attorney, Agent, or Firm* — Thomas Adams

(57) ABSTRACT

A laser for generating laser light pulses comprises a cavity containing an active optical gain medium (102) and a spectral filtering device (104), a delay device (110) for delaying light by a predetermined delay time ($\Delta t$), means (106) for extracting a portion of laser light from the cavity, launching said portion into said delay means (110) and returning the delayed portion to the optical gain medium (102), control means (116) operable to activate the gain medium for a first time period (C1) to produce a first laser light pulse (LP1) having a duration that is less than the delay time ($\Delta t$), and activate the gain medium for a second time period (C2) while a said delayed portion of the first light pulse that has been delayed by the delay means (UO) is traversing the gain medium (102), thereby to produce a second laser pulse (LP2) having a shorter duration and faster risetime than the first laser light pulse (LP1), and output means (108) for outputting the second laser light pulse (LP2).

27 Claims, 6 Drawing Sheets

OTHER PUBLICATIONS

Rossaro et al "Spatially Resolved Chromatic Dispersion Measurement by a Bidirectional OTDR Technique" IEEE Journal on Selected Topics in Quantum Electronics, vol. 7, No. 3 pp. 475-483, Jun. 2001.

Sunnerud et al " Measurement of Polarization Mode Dispersion Accumulation Along Installed Optical fibers" IEEE Photonics Technology Letters, vol. 11, No. 7, pp. 860-862 Jul. 1999.

* cited by examiner

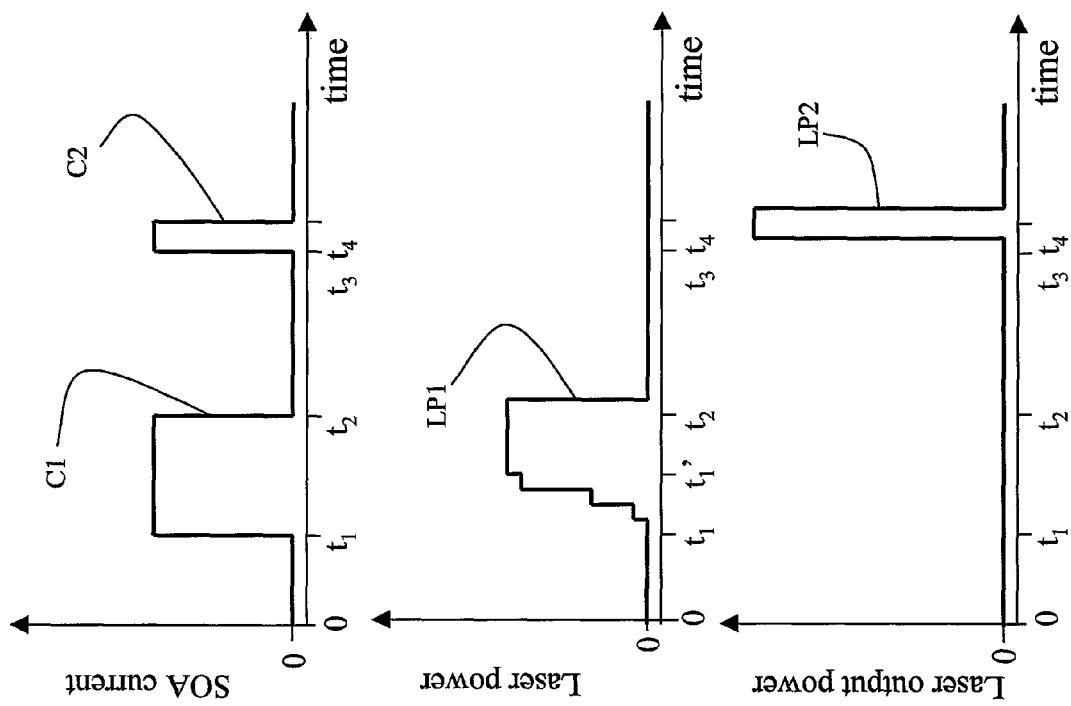

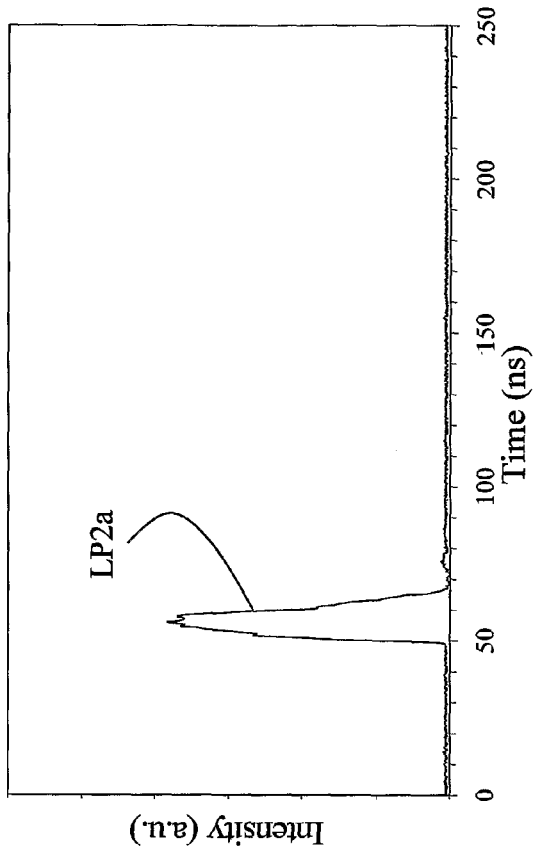
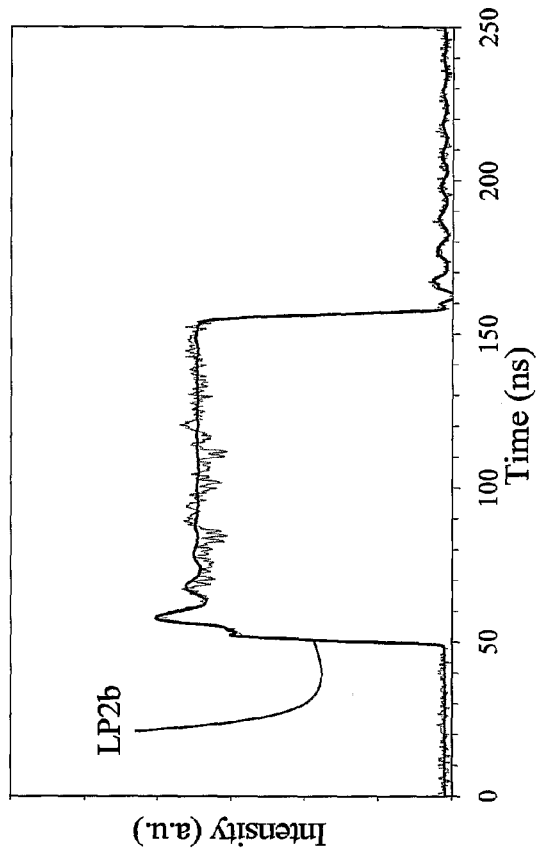
FIG. 3A
FIG. 3B

LASER FOR PROVIDING PULSED LIGHT AND REFLECTOMETRIC APPARATUS INCORPORATING SUCH A LASER

CROSS-REFERENCE TO RELATED APPLICATION/DOCUMENT

The present application claims priority from U.S. Provisional patent application No. 60/831,448 filed Jul. 18, 2006, the entire contents of which are incorporated herein by reference.

The present application is related to Disclosure Document No. 596,093 entitled "Method and Apparatus for Short Pulse and High Power OTDR" filed in the United States Patent and Trademark Office on Mar. 9, 2006. The entire contents of this Disclosure Document are incorporated herein by reference.

TECHNICAL FIELD

This invention relates to lasers for providing pulsed light and to reflectometric apparatus incorporating such a laser.

BACKGROUND ART

As discussed in U.S. Pat. No. 5,179,420 (So), for example, in semiconductor-based, short-cavity lasers, such as Fabry-Perot-type (FP) lasers and distributed feed back (DFB) lasers, photon residence time is relatively short, so they are capable of producing pulses of short duration, e.g., <1 ns. Moreover, they can produce pulses of variable duration (<1 ns to continuous wave) and with an arbitrary pulse repetition rate. Consequently, these lasers have been preferred for use with commercially-available optical time domain reflectometers (OTDRs), instruments which are capable of launching a series of pulses of various durations and repetition rate, making them suitable for characterizing optical fibers in optical communications networks.

In a paper entitled "Analysis and design of Q-switched erbium-doped fiber lasers and their application to OTDR", J. of Lightwave Technology, 20(8), pp. 1506-1511 (2002), S. Adachi, Y. Koyamada explained that longer cavity lasers, such as fiber ring lasers or extended linear-cavity lasers, despite their long photon residence time, can also produce narrow pulses when operated in mode-locked or Q-switched operation, but they cannot readily produce both very short pulses and pulses of variable duration or arbitrarily variable repetition rate, and hence have hitherto been considered ill-suited for most OTDR applications.

It is possible to produce fast rise-time short light pulses for such long cavity lasers by using an external optical modulator to modulate the CW light of the long cavity laser and an optical amplifier to compensate the loss from the modulator, as disclosed by A. Rossaro, M. Schiano, T. Tambosso, D. D'Alessandro, "Spatially resolved chromatic dispersion measurement by a bidirectional OTDR technique", IEEE J. of Selected Topics in Quantum Electronics, 7(3), pp. 475-483 (2001) and by H. Sunnerud, B.-E. Olsson, P. A. Andrekson, "Measurement of polarization mode dispersion accumulation along installed optical fibers", IEEE Photonics Technology Letters, 11(7) pp. 860-862 (1999). but this approach may be prohibitively expensive.

The optical emission from most OTDRs that are commercially-available today is centered about one discrete wavelength, although in recent years a number of OTDRs have become available comprising several DFB lasers which can be selected individually to provide pulses at three or four different discrete wavelengths, for example 1310 nm, 1490 nm, 1550 nm and 1625 nm. However, many applications require a tunable OTDR, i.e., an OTDR whose wavelength can be set to any wavelength within a relatively broad range. See, for example, the paper by Sunnerud et al. (supra).

For example, dense wavelength-division multiplexing (DWDM) systems and coarse wavelength-division multiplexing (CWDM) systems may require an OTDR that can measure the distributed loss of a fiber at each of a plurality of ITU-grid optical frequency channels; polarization mode dispersion (PMD) measurements (e.g., polarization-sensitive OTDR, or POTDR, for distributed measurements) may require a pulsed-output laser having a wide wavelength tuning range and relatively narrow linewidth, for example, as described in recently published international patent application No. WO/2007/036051. Also, accurate single-ended chromatic dispersion (CD) measurements (CD-OTDR) using a Fresnel reflection at the end of an optical fiber link may entail measurements at wavelengths differing by as much as 100 nm.

It is possible to obtain a pulsed output of varying duration from a continuously-tunable OTDR, for example an external cavity laser (ECL), by directly modulating the gain medium. However, such lasers often exhibit an unacceptably wide laser linewidth upon direct modulation, as a result of the relatively wide spacing between adjacent longitudinal cavity modes (typically 10 GHz for a 15-mm cavity length). Also, depending upon the cavity length and the relaxation oscillation dynamics of such lasers, it may be impossible to produce optical pulses having a rise time less than 1 ns. Consequently, one frequently is obliged to use an external optical modulator or switch, for example an acousto-optical modulator (AOM), to shape the output pulse.

Optionally, an optical amplifier, for example an erbium-doped fiber amplifier (EDFA), may be deployed after the tunable laser to compensate for loss from the optical modulator (switch) in order to achieve a high optical peak power with short pulses and fast risetimes (see, for example, the paper by Sunnerud et al. (supra)). Alternatively, the EDFA/AOM combination may be replaced by a semiconductor optical amplifier (SOA), which can be modulated to produce amplified pulses and, when no current is applied, will very strongly attenuate light impinging upon it (see, for example, WO/2007/036051). A disadvantage of these "extra-cavity" optical components (EDFA, AOM and SOA) is that they are very expensive, so such a pulsed laser may not be viable for many commercial applications, for example tunable OTDRs having a widely-variable pulse duration and short risetime.

DISCLOSURE OF THE INVENTION

The present invention seeks to at least mitigate one or more limitations of such known lasers, or at least provide an alternative. To this end, according to one aspect of the present invention there is provided a laser for generating laser light pulses comprising:

a cavity containing an active optical gain medium and spectral filter means for limiting the bandwidth of light passing through the gain medium;

delay means for delaying light by a predetermined delay time ($\Delta t$);

means for extracting a portion of laser light from the cavity, launching said portion into said delay means and returning the delayed portion to the optical gain medium;

control means operable to activate the gain medium for a first time period to produce a first laser light pulse having a duration that is less than the delay time ($\Delta t$), and activate the gain medium for a second time period while a said delayed portion of the first light pulse that has been delayed by the delay means is traversing the gain medium, thereby to produce a second laser pulse having a shorter duration and faster risetime than the first laser light pulse, but having a pulse duration that is shorter than the delay time ($\Delta t$);

and output means for outputting the second laser light pulse.

The spectral filter means may be tunable, conveniently by the same control means, to adjust the wavelength of the light in the cavity. Where the cavity laser has a ring topology, the spectral filter means may limit the bandwidth of light circulating through the gain medium.

Preferably, the spectral filter means is tunable by the control means to adjust the center wavelength of the laser output light pulse to any of a predetermined range of wavelengths.

The gain medium may comprise a semiconductor optical amplifier.

The delay means may comprise a length of optical fiber, the delay time ($\Delta t$) then being equivalent to the time taken for the light pulse portion to traverse the fiber route back to the optical gain medium.

The optical fiber may be terminated by a reflective means, such as a high-reflectivity reflector (mirror), the delay time ($\Delta t$) then being equivalent to the time taken for the light pulse to traverse the fiber in both directions.

Alternatively, the optical fiber may be connected so that the light pulse portion travels along the optical fiber in one direction only and is returned to the cavity to pass through the gain medium. Thus, such optical fiber may be connected to the cavity at one end by a first coupling means, for example a beam splitter, to extract the light pulse portion and at its opposite end by a second coupling means, for example a coupler or circulator, to return the light pulse portion to the gain medium.

The delay means may comprise a polarization-maintaining fiber (PMF). Alternatively, the delay means may comprise a regular (i.e., non-PMF) fiber in conjunction with a polarization controller. Likewise, the components of the cavity may be interconnected by PMFs or regular fibers with polarization controllers.

According to a second aspect of the invention, there is provided optical reflectometric apparatus comprising a laser according to the first aspect together with means for launching the output pulse into a device under test (DUT), e.g., a fiber under test (FUT), detection means for detecting corresponding reflected light and providing a corresponding electrical signal, and processing means for processing the electrical signal to determine one or more parameters or characteristics of the device under test Such reflectometric apparatus may comprise an OTDR, a POTDR, a CD-OTDR, or an instrument combining the functions or two or more of the above, or using reflectometry for some other purpose.

Various objects, features, aspects and advantages of the present invention will become more apparent from the following detailed description, taken in conjunction with the accompanying drawings, of preferred embodiments of the invention, which are described by way of example only.

BRIEF DESCRIPTION OF DRAWINGS

FIGS. 2A, 2B and 2C illustrate, respectively, SOA control pulses, laser light from the laser cavity as sent into the delay line; and the final high power, short light pulse exiting the laser;

FIGS. 3A and 3B depict measured final high power, short light pulses exiting a prototype laser configured as shown in FIG. 1A;

DETAILED DESCRIPTION OF PREFERRED EMBODIMENTS

Figure 1A:
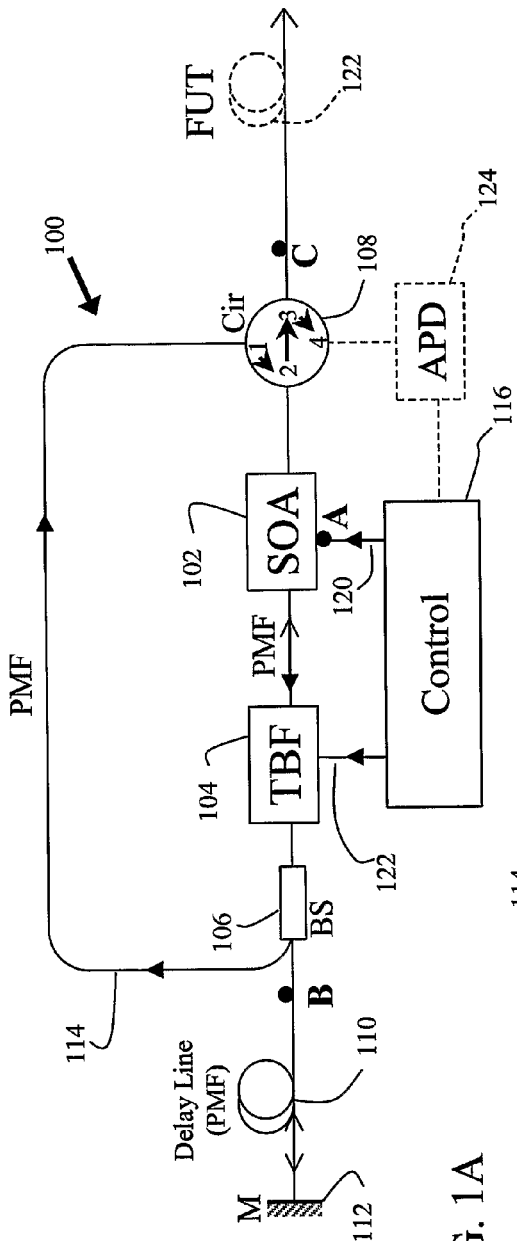
FIG. 1A is a simplified block schematic diagram of a first embodiment of the invention in the form of a laser with a gain medium (SOA), an optical bandpass filter and a delay line, together with a control unit.

In the drawings, the same or corresponding items in different Figures have the same reference numerals, with a suffix or prime indicating a slight difference.

Referring to FIG. 1A, a tunable laser 100 for providing output pulses comprises a semiconductor optical amplifier (SOA) 102, a tunable optical bandpass filter (TBF) 104, a beamsplitting coupler (BS) 106 and a four-port circulator (Cir) 108 connected in a ring topology by polarization-maintaining fibers (PMF). The coupler 106 has a first port connected to the SOA 102 by way of the TBF 104, a second port connected via a PMF loop 114 to the circulator 108 and a third port connected to one end of a delay line 110, the opposite end of which is terminated by a reflector (M) 112. Thus, the ring comprises a first, amplification path which extends between the circulator 108 and the coupler 106 and contains the SOA 102 and a second, feedback path provided by PMF 114 which extends between coupler 106 and circulator 108.

The coupler 106 extracts a portion, for example, ~10-90% of the light in the cavity and launches it into the delay line 110, the residue (ranging from 90% down to 10%), entering the PMF 114. Following reflection by the reflector 112, the light portion returns to the coupler 106 and re-enters the cavity after a delay $\Delta t$ equivalent to the round trip propagation time of the delay line 110. Conveniently, the delay line 110 comprises a fiber pigtail of polarization-maintaining fiber and the reflector 112 comprises a mirror with a reflectivity of about 95% at the end of the fiber pigtail. Of course, other suitable known forms of delay line and of reflector could be used.

A control unit 116 is coupled to the SOA 102 and the TBF 104 by lines 120 and 122, respectively, whereby it supplies control signals to turn the SOA 102 current on and off selectively, as will be described in more detail later, and controls a motor that adjusts the center wavelength of the TBF 104.

FIGS. 3A and 3B, depict measured, final, high power, short light pulses having pulse durations of ~10 ns and ~100 ns, respectively, exiting a prototype laser configured as shown in FIG. 1A which had an operational wavelength of 1550 nm and used a first current pulse C1 of 1000 ns, a delay time of 500 ns, and second current pulse C2 of 10 ns (for FIG. 3A) or 100 ns (for FIG. 3B) with a delay line length of ~120 m. The current pulses C1 and C2 applied to the SOA 102 were equal to each other at about 800 mA and the operating temperature was 25° C. (Currents C1 and C2, and the operating temperature, could, of course, be different, depending upon the SOA or the application).

Figure 4A:
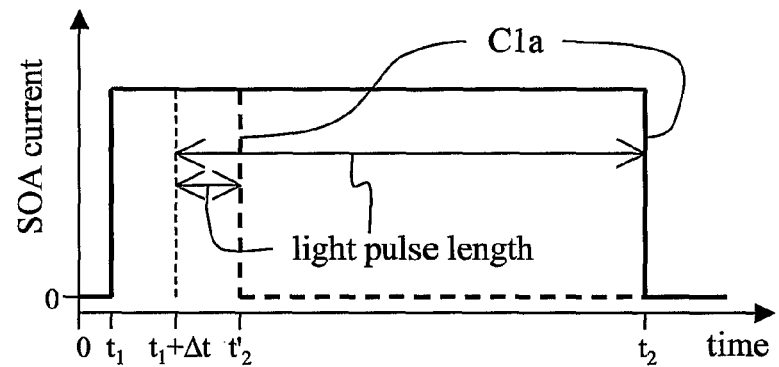
FIG. 4A illustrates an SOA control pulse.

FIG. 3A was obtained without averaging, but in FIG. 3B the solid black curve represents averaging over 128 individual traces while the grey curve represents an individual light pulse without any averaging;

FIG. 4A illustrates an SOA control pulse comprising one electronic current pulse from $t_1$ to $t_2$ (solid line for the case shown in FIG. 4C), or $t_1$ to $t'_2$ (dashed line, for the case FIG. 4B), i.e., current pulse duration of $t_2-t_1$ or $t'_2-t_1$, respectively, is applied to the is SOA 102. For simplicity, the following description is with reference to the 'solid line' control pulse only. The duration of a generated light pulse can be approximated by $t_2-(t_1+\Delta t)$ where $\Delta t$ is the delay provided by delay line 110; this approximation neglects a small, additional term due to the laser cavity length.

Figure 4B:
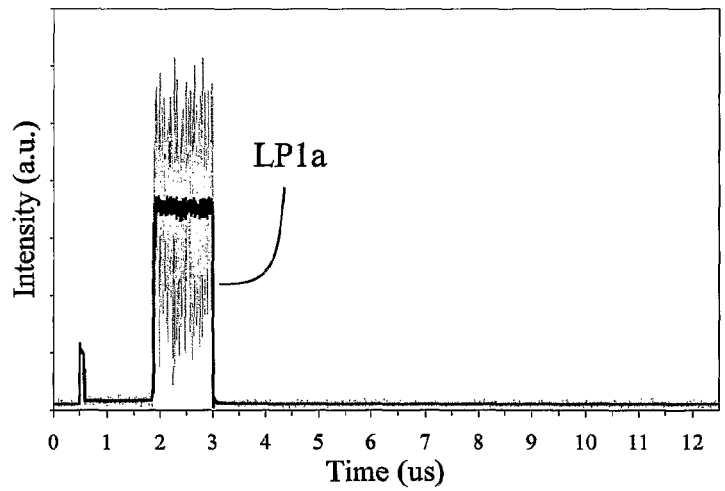
FIGS. 4B and 4C depict measured, final, long light pulses exiting a laser configured as shown in FIG. 1A and using one current pulse of 2.5 µs (for FIG. 4B) or 10 µs (for FIG. 4C)
Figure 4C:
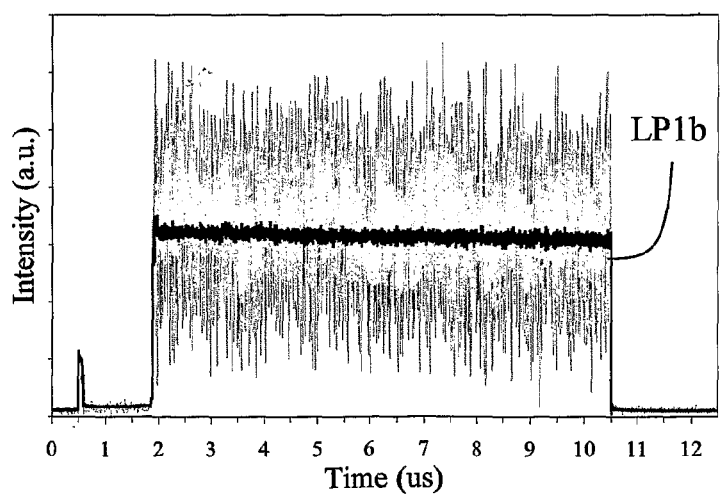

FIGS. 4B and 4C illustrate measured, final, long light pulses having pulse durations of ~1 µs and ~8.5 µs, respectively, exiting the laser configured as shown in FIG. 1A operating at wavelength 1550 nm and using one current pulse of 2.5 µs (for FIG. 4B) or 10 µs (for FIG. 4C) with a delay line length of ~120 m. The current applied to SOA 102 was about 800 mA and its operating temperature was 25° C. In FIGS. 4B and 4C, the black solid curves represent averaging of 128 individual traces while the grey curves each represent an individual light pulse without any averaging. It should be noted that the observed first small "sharp" light pulse (in both FIG. 4B and FIG. 4C) is an ASE light pulse that is usually very broadband for about 100 nm for the configuration of FIG. 1A, but can be significantly reduced if the optical configuration of FIG. 1B is employed.

The tunable laser illustrated in FIG. 1A is a comparatively high SSE device, because, when the SOA 102 is first turned on (and hence lasing action has not yet begun), roughly half of the broadband source spontaneous emission (SSE) and/or amplified spontaneous emission (ASE) from the SOA 102 passes directly from SOA 102 and exits through port 3 of the circulator 108 to form a small, broadband ASE light pulse from the first electronic current pulse of the SOA 102. However, as laser oscillation is fully established after a time interval equivalent to several round trips in the cavity, this residual ASE is significantly repressed.

Figure 1B:
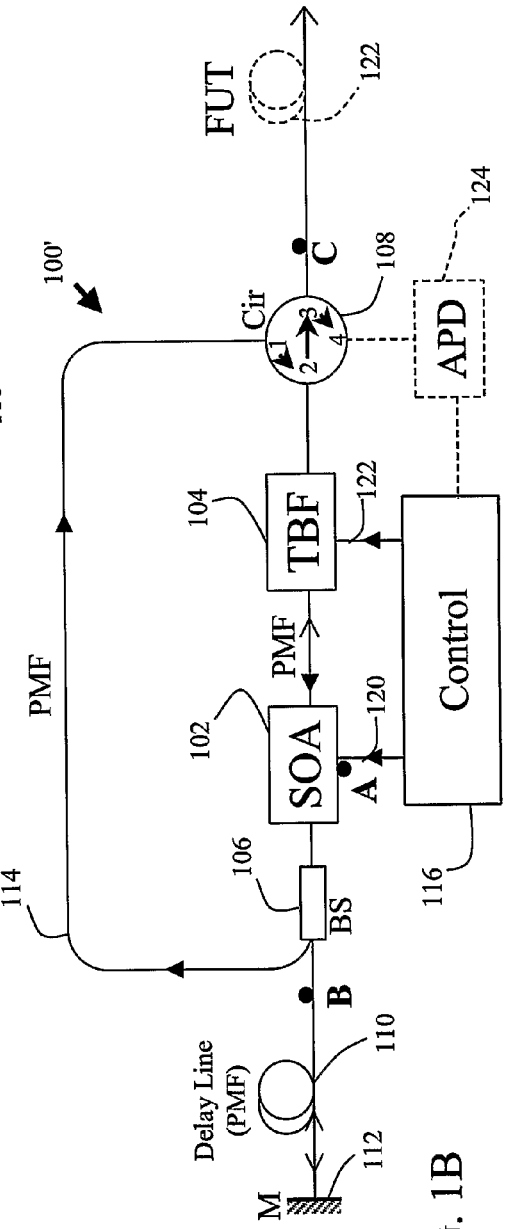
FIG. 1B is a simplified block diagram of a laser similar to that shown in FIG. 1A but with the gain medium and the optical bandpass filter transposed.

FIG. 1B illustrates a low-SSE equivalent which is virtually identical to that shown in FIG. 1A, differing only in that the SOA 102 and the TBF 104 are transposed. Thus, in the laser shown in FIG. 1B, the SOA 102 is connected to the beam-splitting coupler 106 and the TBF 104 is connected to the circulator 108. This is a "low optical noise" device because the broadband SSE and/or ASE from the SOA 102 are/is largely filtered by the TBF 104. Typically, the presence of the filter 104 will increase the signal-to-SSE/ASE ratio by at least 20 dB, depending upon filter spectral bandwidth, the spectral bandwidth of the SOA gain medium, and the ASE power density of the SOA at or near the operating wavelength, etc. It should be noted that, in the laser shown in FIG. 1B, the positioning of the TBF 104 after the output of the SOA 102 significantly decreases the ASE light level from first electronic current pulse of the SOA. However, the presence of the TBF 104 between the SOA 102 and the FUT 122 also reduces the peak pulse power by an amount roughly equivalent to the insertion loss of the TBF 104. Moreover, in such a case, the TBF 104 would also somewhat reduce the laser pulse linewidth.

In many cases, there may be an additional, generally small, reduction in the peak power arising from the non-linear properties of the SOA 102, namely the tendency of an SOA to spectrally broaden the effective laser linewidth via four-wave mixing or other non-linear effects, thereby reducing the fraction of the laser power at or near the operating wavelength of the TBF 104. A low SSE/ASE design is particularly suitable for those applications requiring distributed wavelength-dependent loss measurements based on Rayleigh backscattering, whereas low SSE/ASE is generally not as important for those reflectometric applications measuring CD or PMD.

FIGS. 2A, 2B and 2C depict signals at points A, B and C, respectively, for the laser configuration of FIG. 1B (the "low-SSE/ASE" case). It should be appreciated, however, that, except for the presence of some additional optical noise and a somewhat higher peak optical output power in the case of the configuration of FIG. 1A, the operation of the two configurations depicted in FIGS. 1A and 1B is substantially the same. Such operation will now be described with reference to FIGS. 2A, 2B and 2C.

As illustrated in FIG. 2A, the control unit 116 supplies a square current pulse C1 to the SOA 102 to turn the SOA 102 on at time $t_1$ and off again at time $t_2$. Between times $t_1$ and $t_2$, the SOA 102 acts as a gain medium to produce a lasing oscillation in the fiber ring cavity.

As depicted in FIG. 2B, when the SOA 102 first is turned on, the lasing oscillation will be relatively low in amplitude. During several subsequent traversals of the ring cavity (in the clockwise direction in FIGS. 1A/1B), the light level will increase in a series of steps, as can be seen from the "staircase" or stepwise increase in the leading edge of the light pulse LP1 shown in FIG. 2B between times $t_1$ and $t_1'$. Between times $t_1'$ and $t_2$, the amplitude of pulse LP1 is a maximum, i.e., the SOA 102 having attained its saturation power. As described hereinbefore, while most of the lasing light circulates around the cavity, being returned to the SOA 102 by way of the circulator 108, the coupler 106 passes a portion of the light into the delay line 110, to be reflected by the reflector 112 and returned via the coupler 106 to the SOA 102.

The time interval $t_2-t_1$ depicted in FIG. 2B is less than or equal to the total time delay $\Delta t$ provided by the delay line 110, i.e., the time taken for the extracted portion of the laser pulse LP1 to traverse the delay line 110 in both directions. Consequently, when the delayed portion of the laser pulse LP1 re-enters the SOA 102 in the opposite direction, i.e., shown as "left-to-right" in FIGS. 1A/1B, the SOA 102 is "off" and substantially no laser light leaves the ring cavity via the circulator 108.

As shown in FIG. 2A, the control unit 116 provides a second current pulse C2 having a duration that is shorter than mat of the first current pulse C1. The time interval $t_3-t_2$ between the end of the first current pulse at time $t_2$ and the beginning of the second current pulse at time $t_3$ is selected such that the (delayed) light pulse portion returning from the delay line 110 will have reached, or almost reached, its maximum. Thus, time interval $t_3-t_1$ between the rising edges of current pulses C1 and C2, respectively, is greater than the total delay $\Delta t$ plus the risetime $(t_1'-t_1)$ of the "staircase-like", leading edge of LP1, i.e., $t_3-t_1>\Delta t+(t_1'-t_1)$. This ensures that, when the SOA 102 turns on again, the delayed light pulse portion re-entering the SOA 102 from the delay line 110 has reached or is nearly at its maximum. Moreover, the time $t_4$ at which the SOA 102 is turned off again must occur while part of the delayed light from pulse LP1 is still traversing the SOA 102. Hence, $t_4-t_2<\Delta t>t_3-t_1$.

As shown in FIG. 2C, when turned on this second time, the SOA 102 modulates and amplifies the laser light portion returning from the delay line 110 and the resulting amplified pulse LP2 passes from the SOA 102, through the circulator 108 and to the output of the laser 100, usually to a device-under-test, shown as a fiber-under-test (FUT) 122 in FIGS. 1A and 1B. It should be noted that the re-shaped (modulated) and optically amplified light pulse LP2 leaving the output of the laser corresponds to a "slice" of the initial pulse LP1, but has both a higher power level and a faster risetime than the initial pulse LP1, a portion of which traversed the delay line 110, and does not exhibit the stepwise or "staircase" behavior on its leading edge, i.e., it has a "cleaner", virtually vertical leading edge.

It should be noted that FIGS. 2A and 2B show a slight delay between the rising and falling edges of the current pulse C1 and the corresponding rising and falling edges of the light pulse LP1. The same applies to the second current pulse C2 and second light pulse LP2. As mentioned earlier, this small additional delay corresponds to the laser cavity length; for convenience, this delay will be ignored during the following description.

The control unit 116 can be used to adjust the width of the output light pulse LP2 by adjusting the width of the second current pulse C2, i.e., by varying the difference between times $t_3$ and $t_4$. In addition, by adjusting the current to the SOA 102 via the control line 120, the control unit 116 can control the power (consequently also slightly adjust the laser linewidth) of the output light pulse LP2. In addition, the control unit 116 can be used to change the actual wavelength of the light pulse LP1, and by consequence that of LP2, by adjusting the wavelength selected by the TBF 104 (with a designable pass bandwidth ranging from, typically, less than 0.03 nm to more than 1 nm). In the embodiment shown in FIG. 1B, the TBF 104 will remove a significant amount of ASE from the light leaving the laser output.

It should be noted that, in order to generate a good "flat-top" short light pulse shape using two current pulses as described above, one requires that the residual light in the cavity, due to ASE generated when the SOA 102 is turned on again, have a negligible effect on the operation of the SOA 102 when, responsive to the second current pulse C2, it modulates and amplifies the light pulse (LP1) portion returning from the delay line 110. In general, if the net gain, i.e., the gain of the SOA 102 in the cavity minus the laser cavity loss, is less than zero, then the residual ASE in the cavity (which usually is of very low power because it has been limited by the bandwidth of the TBF 104) cannot be amplified. Consequently, this weak optical noise would have a negligible effect on the shape of the output light pulse, so a good pulse shape can be obtained provided that the above-mentioned condition $t_4-t_2<\Delta t<t_3-t_1'$ is satisfied. This negative net gain in the cavity may arise because the higher-power returning delayed pulse LP1 saturates the available SOA gain, leaving insufficient SOA gain to sustain ASE-seeded laser action.

If, however, the net gain is greater than zero, for example, the gain of the SOA 102 for the laser cavity may not be sufficiently suppressed during the duration of the second current pulse C2, as may occur when the returning delayed pulse LP1 is weak, then the residual filtered ASE light in the cavity may be amplified, leading to ASE-seeded laser action after several cavity roundtrips. This ASE-seeded laser action would reduce the gain of the SOA for the returning delayed pulse LP1, thereby affecting the shape of the final output light pulse, i.e. the light intensity of output pulse LP2 would decrease with respect to time.

For example, the final output light pulse may experience a decreased light intensity after a time equivalent to several round trips of the cavity. In fact, under this condition, the laser may still produce a good pulse shape for a very short pulse duration if a required pulse duration is not too long, such as not longer than few round trip times (i.e., before the ASE is itself amplified in the cavity and starts to affect the shape of the output light pulse). For example, if a cavity round-trip time is 100 ns (i.e., for a traveling-wave-based cavity length of 20 m) and the attainment of lasing oscillation requires a few cavity round trips, then the pulse laser may produce light pulses having a duration of <5 ns to ~300 ns with a good 'flat-top' pulse shape if the delay line 110 is sufficiently long (e.g., approximately 50 m).

It would still be possible, however, to obtain a good flat-top long pulse by using a long cavity length, i.e., to give a long cavity round-trip time. Alternatively, one could increase the loss of the laser cavity 114 (i.e., to increase the number of round-trip times before the onset of lasing oscillation) and/or reduce the overall loss of the delay line 110. Such a reduction could be effected by increasing the portion of light being sent into and received from the delay line 110 via the coupler 106, (thereby suppressing the SOA gain of the laser cavity), which would increase the number of cavity round-trip times before the optical noise (ASE) level starts to have a notable influence upon the second current pulse C2 operation of the SOA 102, or even, perhaps, to meet the aforementioned condition where net gain is less than zero.

It should be noted that SOA 102 not only acts as a gain medium for the fiber ring laser but also, during the interval between $t_3$ and $t_4$, acts as an optical modulator (switch) and an optical amplifier for the light returning from the delay line 110. The optical circulator 108 not only acts as an output for the light leaving the OTDR but also acts as an isolator in the SOA-based fiber laser cavity, enforcing traveling-wave propagation (clockwise, as shown in FIGS. 1A to 1D).

Because the same SOA 102 is used as a lasing oscillator, optical modulator and optical amplifier, there will be a saving in overall cost, yet the laser will still produce a high-power short-pulse light with a very fast rise time, widely-tunable wavelength and a narrow linewidth. Further savings may be realized where the same TBF 104 is used for filtering away most of the broadband ASE coming from the SOA 102—as in the low-SSE configuration shown in FIG. 1B.

The embodiments of the invention described with reference to FIGS. 1A and 1B are especially suitable for producing short period pulses, particularly where the generated pulse durations are not more than the total equivalent delay time of the delay line 110. To use the same embodiments to generate a long pulse, for example with a pulse period >2.5 μs to 20 μs, would not usually be practical, however, because it would require the delay line length to be between 250 m and 2,000 m. A disadvantage of such a long delay line length would be its high cost and large size. Nevertheless, the embodiments of FIGS. 1A and 1B could be used to produce a long light pulse, for example from 275 ns to 20 μs, while still using a short delay line, such as a delay line 110 having a length of less than 30-50 m. This can be achieved by using the control means 116 to activate the gain medium for only one time period that is longer than the delay time ($\Delta t$), thereby producing an output laser pulse of up to 20 μs, or more, though its risetime might be relatively slow in comparison to that which could be generated using two current pulses (e.g., usually equivalent to several cavity roundtrip times, dependent upon the gain in the cavity).

Thus, referring to FIG. 4A, to generate a long light pulse (for instance, a pulse having a duration greater than the delay time ($\Delta t$) provided by the delay line 110) one current pulse C1a for the gain medium of SOA 102 may be used. This current pulse C1a having a length of $t_2-t_1$ may produce an output light pulse having a duration slightly less than or equal to $t_2-(t_1+\Delta t)$, where $\Delta t$ is the overall equivalent delay time provided by the delay line 110.

FIGS. 4B and 4C illustrate measurement taken using a prototype tunable pulse laser configured as shown in FIG. 1A with a delay-line length of ~120 m for generating long pulse durations of ~1 µs and ~8.5 µs by means of one SOA current pulse of 2.5 µs (for FIG. 4B) and 10 µs (for FIG. 4C), respectively.

It should be noted, however, that production of a reasonable "flat-top" long pulse shape may require a total delay line 110 loss that is approximately equal to the loss of the laser cavity 114 (i.e., requiring that the power level of the delayed light returning to the SOA 102 and that of the intra-cavity light incident upon the SOA 102 be approximate equal). Notwithstanding that, the laser might still work if the delayed light returning to the SOA 102 were much weaker, though that would lead to the output pulses having reduced power levels. On the other hand, if the delayed light pulse returning to the SOA 102 were of significantly higher power than the intra-cavity light, light intensity oscillations would obtain due to a "sudden" large variation in cavity gain; hence, such a case should be avoided if a "flat-top" pulse shape is desired.

As mentioned, the lower the intensity of the light returning from the delay line 110 to the SOA 102, the flatter the shape of the light pulse that could be generated. However, if the intensity of the light portion returning from the delay line 110 to the SOA 102 were too low, the peak power of the resulting output light pulse would be very weak. Thus, while it is desirable for the intensity of the light portion returning from the delay line 100 to the SOA 102 to be high enough to ensure that the peak power of the output light pulses is adequate, the intensity level should not be so high mat it induces too much gain "oscillation" in the cavity. It is expected that optimal operating conditions may be obtained when the optical power of the light portion returning from the delay line is similar as the optical power of the light circulating in the cavity.

It should be noted that this operation with a single electronic current pulse also requires the net gain, i.e. the gain of the SOA 102 in the cavity minus the cavity loss, to be greater than zero.

The measurements illustrated in FIG. 4B indicate that the laser configuration shown in FIG. 1A, with a delay line of ~120 m and one electronic current pulse of ~2.5 µs, would be especially robust for generating an output light pulse having a duration of ~1 µs, as it is a particular case which avoids the oscillations that otherwise would be associated with a strong returning light pulse, since the delay $\Delta t$ is longer than the pulse duration. The output light would have a reasonably good pulse shape for any operating condition discussed above, such as a net gain of the cavity being either <0 or >0. It should also be noted that, more generally for such a laser configuration, a desirable laser pulse duration (T) preferably is slightly less than the delay ($\Delta t$) from the delay line 110 and also equal to the current pulse length ($t'_2-t_1$) minus the delay ($\Delta t$) from the delay line 110, as shown in FIG. 4A, i.e., $T \leq \Delta t$, $T \cong t'_2-t_1-\Delta t$ and $t'_2-t_1 > \Delta t$ (i.e. $\Delta t < t'_2-t_1 \leq 2\Delta t$).

It will be appreciated that the configurations of the lasers embodying the present invention may differ slightly to satisfy different light pulse requirements for different applications. Usually a tunable OTDR may impose the strictest requirement for the pulse laser design because it not only requires the laser to provide all standard OTDR light pulse durations, such as from 5 ns to 20 µs, but may also require the output light pulses to have a low SSE/ASE.

Output light pulses having a low SSE/ASE may be obtained using a laser configuration as shown in FIG. 1B with the TBF 104 having a bandwidth sufficiently narrow that a large fraction of ASE light is removed from the output fight pulses.

In order to generate all of the light pulse lengths usually required by OTDRs, an overall loss provided by the losses of the delay line 110 and the intervening coupler 106 and the TBF 104 (for FIG. 1A), should be arranged to be approximately equal to or less than that from the laser cavity, as described above, so that the laser may be able to produce long length pulses by using single electronic current pulses.

Moreover, in order to generate short pulses, the delay line and the cavity must also be designed to satisfy the condition for two-pulse operation as described above to produce short pulse durations, for example having an equivalent delay time over 300-500 ns (i.e. a delay line length of 30-50 m such as for the optical design shown in FIG. 1B) and a cavity round-trip time >50 to 100 ns (i.e. a cavity length of >10 to 20 m such as for the optical design shown in FIG. 1B) so that the laser could produce short pulse lengths from 5 ns to 100 ns by use of two electronic current pulses operation. It should also be noted that, where the pulsed laser is tunable, the above-described design condition should also be satisfied for all operation wavelengths, i.e., for an entire tuning range.

The lasers shown in FIGS. 1A and 1B can be incorporated into a reflectometric instrument by adding suitable components. Thus, FIGS. 1A and 1B show, in dashed lines, a detector 124, specifically an avalanche photodiode (APD), coupled to port 4 of the circulator 108 to receive light returning from a fiber-under-test (FUT) 122. The electrical output of the detector 124 is coupled to the control unit 116 which will have a processor programmed to provide the usual OTDR control, processing and display functions.

The present invention encompasses various alternatives to the above-described embodiments, and modifications thereto. Thus, the TBF 104 could be placed anywhere in the cavity. For example, it could be inserted in the feedback path of the ring, i.e., in the feedback path (fiber loop) 114 between the coupler 106 and the circulator 108.

For reflectometric applications requiring distributed wavelength-dependent loss measurements based primarily on Rayleigh backscattering (e.g. "traditional" OTDR for distributed loss measurement), the laser should emit very little or no residual light ("noise") before and after emission of a pulse, or at wavelengths other than that selected for the measurement (For most other reflectometric applications (e.g. POTDR, CD-OTDR, etc.), this "low-noise" requirement is less critical).

In the embodiment of FIG. 1B, the TBF 104 is between the SOA 102 and the output of the laser, so it will not only control the output wavelength, but also reduce SSE/ASE "noise". Where the TBF 104 is between the SOA 102 and the beam-splitting coupler 106, as in the embodiment of FIG. 1A, however, or the TBF 104 is located in the feedback path between the coupler 106 and port 1 of circulator 108, as described as a modification to the configuration of FIG. 1A, and so does not provide such noise reduction, a second TBF could be provided outside the ring cavity, i.e., between port 3 of circulator 108 and the FUT 122. Of course, such a second TBF could be added to the embodiment of FIG. 1B, but the improvement in noise performance probably would not justify it.

Tunable lasers embodying the present invention may provide wavelength tunability, high peak power and narrow linewidth. They may also be operable to produce light pulses whose lengths range from relatively short, for example <5 ns, to relatively long, for example >20 µs. Such lasers, and reflectometric instruments incorporating them, might best find application in systems operating in the S, C and L bands (from 1460 nm to 1610 nm), though it is envisaged that operation at wavelengths anywhere in, say, the region between 1200 nm and 1700 nm may be achieved by properly choosing the operating wavelength of the SOA 102. The short light pulses generated with the SOA-based fiber ring laser and delay line have many applications, such as for Tunable OTDR, POTDR, and single-end CD-OTDR by using a Fresnel reflection or a fiber-pigtailed mirror at the end of the fiber delay line. For details of a POTDR which could use a tunable pulsed laser source embodying the present invention, the reader is directed to commonly-owned PCT published patent application WO/2007/036051, the contents of which are incorporated herein by reference and to which the reader is directed for reference.

An embodiment of the invention that is especially suited to the measurement of chromatic dispersion (CD) of a fiber link will now be described with reference to FIG. 5, which shows a single-end CD-OTDR, i.e., an instrument for measuring the chromatic dispersion in an optical fiber by measuring the relative time-of-flight propagation for short optical pulses at different wavelengths that are reflected from a reflector 130, e.g., a Fresnel reflector or an attached fiber-pigtailed mirror, at the distal end of the FUT 122. The CD-OTDR 100CD is similar to the OTDR described with reference to FIG. 1B, with the TBF 104 in the feedback path and with a WDM coupler 134 between the SOA 102 and port 2 of the circulator 108. The coupler 134, which advantageously has a very wide bandwidth encompassing the full tuning range of the laser, combines the output from the tunable pulsed laser with the output from a fixed-wavelength laser 136 (e.g. a DFB laser) whose output wavelength, e.g., 1310 nm, is substantially different than any of the wavelengths to be generated by the tunable pulsed laser 100CD. The DFB is controlled by the control, processing and display unit 116 which, in this case, will be programmed to perform the required functions for chromatic dispersion measurement.

In use, the control unit 116 will tune the pulsed laser 100CD to a number of discrete wavelengths within a desired range (e.g. from 1460-1630 nm). For most applications, it is expected that four to eight wavelengths will suffice, but more could be used if so required for a particular application or by a particular user.

Figure 5:
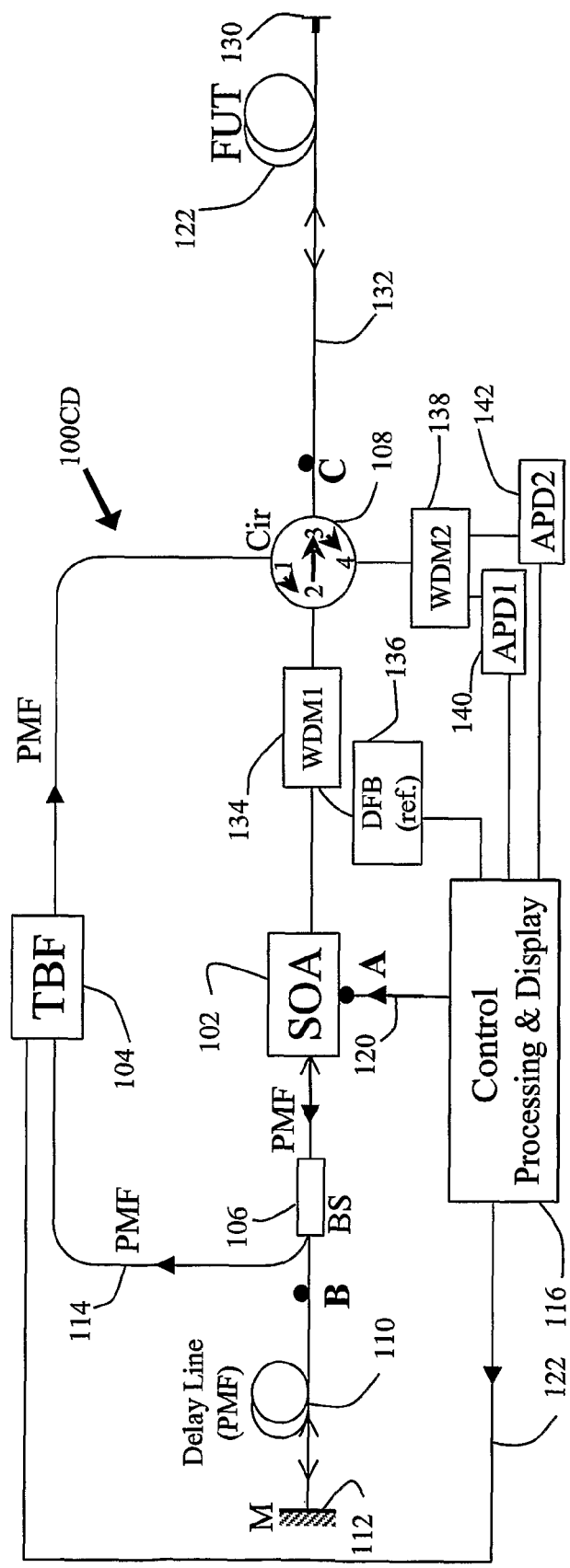
FIG. 5 illustrates an embodiment in the form of a CD-OTDR.

It should be noted that it is possible to achieve a high measurement accuracy using a CD-OTDR employing a tunable pulse laser embodying the present invention because it may provide many tens and even hundreds of different wavelengths for the time-of-flight based single-end CD measurement Thus, referring to FIG. 5, the fixed-wavelength laser 136 and the tunable pulsed laser 100CD are pulsed at the same time, or with a known, pre-determined time difference between them. The two back-reflected pulses, each at a respective one of two widely differing wavelengths, are conveyed by circulator 108 to a second CWDM coupler 138 and detected independently via two detectors 140 and 142 coupled to control, processing and display unit 116.

Alternatively, the back-reflected pulses could be detected on the same detector (without an intervening WDM coupler 138) by choosing said pre-determined delay to be greater than the largest group delay that can be expected with known fiber optic fibers over a maximal measurement distance.

Delaying the back-reflected pulses in this way allows a single detector to be used for such time-of-flight measurements, in contrast to such a method disclosed in recently-issued U.S. Pat. No. 7,016,023, which, as described, cannot do so because there is no way for the (single) detector to distinguish between the back-reflected pulse from the fixed laser and that from the variable wavelength, with the result that ambiguity in the measurement of the relative group delay would render the method unsuitable for testing of arbitrary unknown fiber types.

Figure 1C:
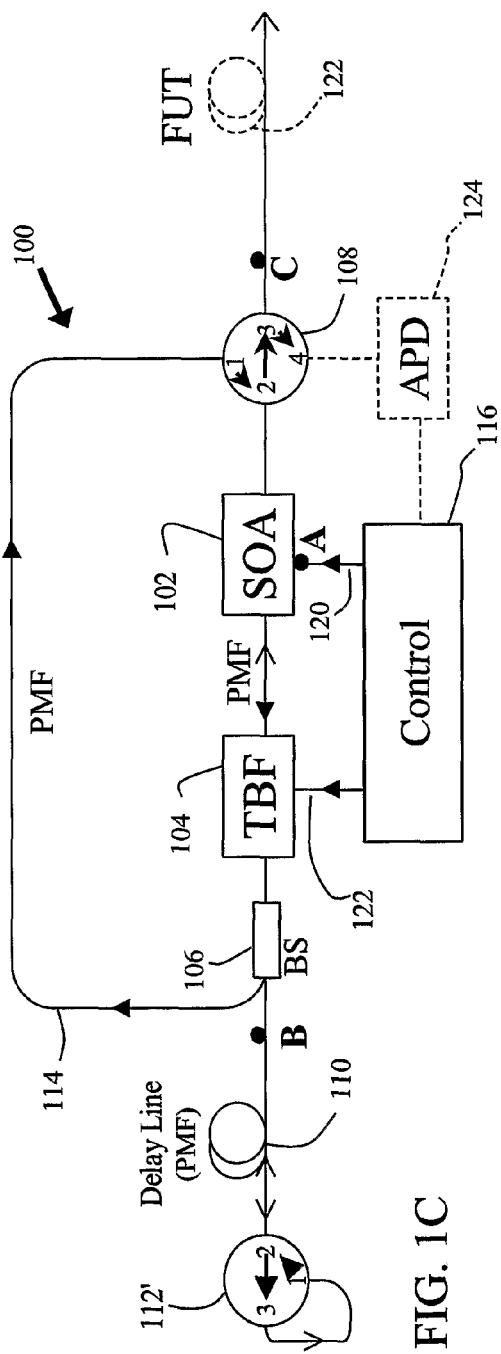
FIG. 1C illustrates a first alternative to the delay line of FIGS. 1A and 1B.

Although the delay means of the above-described preferred embodiment comprises a fiber 110 terminated in a reflector 112, other forms of delay means may be used. For example, as illustrated in FIG. 1C, the reflector 112 could be replaced by a non-reflective means, for example a three-port circulator 112', which receives the fight pulse portion from the distal end of the fiber 110 and returns it into the fiber 110 with its propagation direction reversed.

Figure 1D:
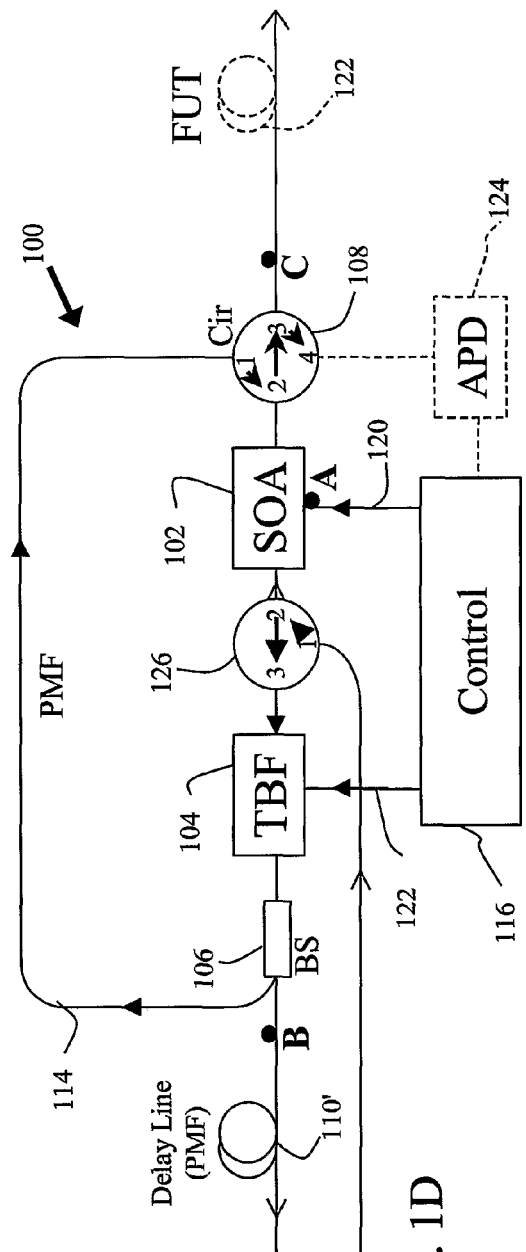
FIG. 1D illustrates a second alternative to the delay line of FIGS. 1A and 1B.

FIG. 1D illustrates an alternative delay means which comprises an optical fiber 110' that is approximately double the length of the fiber 110 of FIGS. 1A and 1B, i.e., substantially equal to the total delay $\Delta t$, and a second three-port circulator 126 which is connected between the TBF 104 and the SOA 102. One end of the optical fiber delay line 110' is connected, as before, to the beamsplitting coupler 106 but its other end is connected to a port of the second circulator 126. In this case, the total delay $\Delta t$ is the time taken for the light pulse to travel from and to the circulator 126 via the TBF 104 and the fiber 110'.

It should be noted that the second circulator 126 could be between the TBF 104 and the coupler 106. Where the positions of the TBF 104 and the SOA 102 are transposed, the second circulator 126 will, of course, be between the SOA 102 and the coupler 106 since the delayed light pulse must be returned to the SOA 102.

Likewise, although the preferred embodiment uses a ring cavity laser, other suitable kinds of laser, such as a linear cavity laser, could be used instead.

INDUSTRIAL APPLICABILITY

Advantageously, semiconductor-based, cavity lasers embodying the present invention provide short pulses with adjustable duration and fast risetimes and use only one gain medium for laser oscillation, modulation and amplification. Embodiments may offer tunability to arbitrary wavelengths over an approximately 150-nm wide range in a spectral window of interest suitable for telecommunications applications, unlike lasers that are commercially viable at this time.

It will be appreciated that the invention encompasses pulse lasers and reflectometric apparatus, including OTDRs, that are not strictly speaking "tunable" but rather have only one operating wavelength or a limited number of wavelengths that can be selected individually.

Although embodiments of the invention have been described and illustrated in detail, it is to be clearly understood that the same are by way of illustration and example only and not to be taken by way of limitation, the scope of the present invention being limited only by the appended claims.

The invention claimed is:

1. A laser for generating laser light pulses comprising:
a cavity having a ring topology containing an active optical gain medium and spectral filtering means for limiting the bandwidth of light passing through the gain medium;
delay means for delaying light by a predetermined delay time ($\Delta t$);
means for extracting a portion of laser light from the cavity, launching said portion into said delay means and returning the delayed portion to the optical gain medium;
control means operable to activate the gain medium for a first time period to produce a first laser light pulse (LP1) having a duration that is less than the delay time ($\Delta t$), and activate the gain medium for a second time period while said portion of the first light pulse that has been delayed by the delay means is traversing the gain medium, thereby to produce a second laser light pulse (LP2) having a shorter duration and faster risetime than the first laser light pulse (LP1); and output means for outputting the second laser light pulse (LP2).

2. A laser according to claim 1, wherein the gain medium comprises a semiconductor optical amplifier.

3. A laser according to claim 1, wherein the delay means comprises a length of optical fiber.

4. A laser according to claim 3, wherein the optical fiber is terminated by a high-reflectivity reflector, said portion traversing said optical fiber in both directions.

5. A laser according to claim 3, wherein the optical fiber is terminated by non-reflective means for receiving said portion of the first laser light pulse from the fiber and returning said portion to the fiber with its direction of propagation reversed, so that said portion traverses said optical fiber in both directions, said delay time ($\Delta t$) comprising the time taken for the portion to traverse the optical fiber and the non-reflective means.

6. A laser according to claim 5, wherein the non-reflective means comprises a circulator having at least three ports, one of its ports connected to the end of the fiber and its two other ports connected together so that said portion enters the circulator through said one of its ports, passes from one to the other of the other two ports, and is conveyed from said other of the two other ports to the first port for entry into the fiber in the reverse direction.

7. A laser according to claim 3, wherein the optical fiber has one end connected to the extracting means and its opposite end connected to coupling means connected between the gain medium and the extracting means so that said portion traverses the optical fiber in one direction only before being coupled into the cavity to pass through the optical gain medium.

8. A laser according to claim 7, wherein the coupling means comprises a circulator.

9. A laser according to claim 3, wherein the optical fiber comprises a polarization-maintaining fiber (PMF).

10. A laser according to claim 1, wherein at least some adjacent ones of components of the cavity are interconnected by PMFs.

11. A laser according to claim 1, having a ring topology, the spectral filtering means limiting the bandwidth of light circulating through the gain medium.

12. A laser according to claim 11, wherein the control means is operable further to adjust a centre wavelength of the spectral filtering means to tune the laser over a predetermined range of wavelengths.

13. A laser according to claim 1, wherein said gain medium is to act as an optical modulator and as an optical amplifier on said second laser light pulse (LP2).

14. Reflectometric apparatus comprising:
a laser for generating laser light pulses and launching the laser light pulses into a device-under-test (DUT),
detection means for detecting corresponding reflected light returning from the device-under-test and providing a corresponding electrical signal, and
processing means for processing the electrical signal to determine one or more parameters of the device-under-test;
the laser comprising a cavity having a ring topology containing an active optical gain medium and spectral filtering means for limiting the bandwidth of light passing through the gain medium, delay means for delaying light by a predetermined delay time ($\Delta t$), means for extracting a portion of laser light from the cavity, launching said portion into said delay means and returning the delayed portion to the optical gain medium, control means operable to activate the gain medium for a first time period to produce a first laser light pulse (LP1) having a duration that is less than the delay time ($\Delta t$), and activate the gain medium for a second time period while said portion of the first laser light pulse that has been delayed by the delay means is traversing the gain medium, thereby to produce a second laser light pulse (LP2) having a shorter duration and faster risetime than the first laser light pulse (LP1); and
output means for launching the second laser light pulse (LP2) as a said laser light pulse into the device-under-test.

15. Reflectometric apparatus according to claim 14, wherein the gain medium comprises a semiconductor optical amplifier.

16. Reflectometric apparatus according to claim 14, wherein the delay means comprises a length of optical fiber.

17. Reflectometric apparatus according to claim 16, wherein the optical fiber is terminated by a high-reflectivity reflector, said portion traversing said optical fiber in both directions.

18. Reflectometric apparatus according to claim 16, wherein the optical fiber is terminated by non-reflective means for receiving said portion of the first laser light pulse from the fiber and returning said portion to the fiber with its direction of propagation reversed, so that said portion traverses said optical fiber in both directions, said delay time ($\Delta t$) comprising the time taken for the portion to traverse the optical fiber and the non-reflective means.

19. Reflectometric apparatus according to claim 18, wherein the non-reflective means comprises a circulator having at least three ports, one of its ports connected to the end of the fiber and its two other ports connected together so that said portion enters the circulator through said one of its ports, passes from one to the other of the other two ports, and is conveyed from said other of the two other ports to the first port for entry into the fiber in the reverse direction.

20. Reflectometric apparatus according to claim 16, wherein the optical fiber has one end connected to the extracting means and its opposite end connected to coupling means connected between the gain medium and the extracting means so that said portion traverses the optical fiber in one direction only before being coupled into the cavity to pass through the optical gain medium.

21. Reflectometric apparatus according to claim 20, wherein the coupling means comprises a circulator.

22. Reflectometric apparatus according to claim 16, wherein the optical fiber comprises a polarization-maintaining fiber (PMF).

23. Reflectometric apparatus according to claim 14, wherein at least some adjacent ones of components of the cavity are interconnected by PMFs.

24. Reflectometric apparatus according to claim 14, wherein the control means is operable further to adjust a centre wavelength of the spectral filtering means to tune the laser over a predetermined range of wavelengths.

25. Reflectometric apparatus according to claim 14, further comprising a fixed-wavelength laser having an operating wavelength substantially different from any of the wavelengths to be generated by the apparatus, and combining means between the cavity and an output port of the apparatus for connection to a transmission medium having a reflector means at a distal end thereof, the combining means serving to combine the output from the pulsed laser with the output from the fixed-wavelength laser, the control means being operable to control the pulsed laser to apply pulses at varying wavelengths to the transmission medium and to detect and process the resulting light returning from the transmission medium to obtain a measure of chromatic dispersion of the transmission medium.

26. Reflectometric apparatus according to claim 25, wherein the transmission medium comprises an optical fiber-under-test (FUT).

27. Reflectometric apparatus according to claim 14, wherein said gain medium is to act as an optical modulator and as an optical amplifier on said second laser light pulse (LP2).

* * * * *